United States Patent
Krymski

(10) Patent No.: US 6,885,331 B2
(45) Date of Patent: Apr. 26, 2005

(54) RAMP GENERATION WITH CAPACITORS

(75) Inventor: Alex I Krymski, La Crescenta, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/661,556

(22) Filed: Sep. 15, 2003

(65) Prior Publication Data

US 2005/0057389 A1 Mar. 17, 2005

(51) Int. Cl.[7] .............................................. H03M 1/56
(52) U.S. Cl. ..................... 341/169; 341/155; 341/170; 341/172
(58) Field of Search ................................ 341/169, 158, 341/172; 250/208.1, 214.1; 348/300, 301, 308

(56) References Cited

U.S. PATENT DOCUMENTS

| | | | | |
|---|---|---|---|---|
| 6,115,066 A | * | 9/2000 | Gowda et al. .............. | 348/308 |
| 6,137,432 A | * | 10/2000 | Xiao .......................... | 341/169 |
| 6,344,877 B1 | * | 2/2002 | Gowda et al. .............. | 348/245 |
| 6,476,751 B1 | * | 11/2002 | Krymski et al. ............ | 341/155 |
| 6,545,624 B1 | * | 4/2003 | Lee et al. ................... | 341/155 |
| 6,567,028 B1 | * | 5/2003 | Huang et al. ............... | 341/155 |
| 6,633,335 B1 | * | 10/2003 | Hwang et al. .............. | 348/308 |
| 6,670,903 B1 | * | 12/2003 | Fujita et al. ................ | 341/155 |
| 6,727,486 B1 | * | 4/2004 | Choi .......................... | 250/208.1 |
| 2002/0122129 A1 | * | 9/2002 | Lee ............................ | 348/308 |

OTHER PUBLICATIONS

T. Sugiki et al, "A 60 mW 10b CMOS Image Sensor with Column–to–Column PPN Reduction," ISSC of Digest of Technical Papers, pp. 108–109, 2000.

* cited by examiner

Primary Examiner—Michael Tokar
Assistant Examiner—Khai Nguyen
(74) Attorney, Agent, or Firm—Dickstein Shapiro Morin & Oshinsky LLP

(57) ABSTRACT

A ramp generator includes an array of capacitors having a common top plate that provides a ramp output signal. Each of the capacitors has a bottom plate switched sequentially between a low reference voltage and a high reference voltage in response to a value in a shift register. For an upward ramp, capacitors can be switched to their high reference voltages in succession, increasing the output voltage on the common top plate; for a downward ramp, capacitors can be switched to their low reference voltages in succession, decreasing the output voltage. The capacitors can be switched by a multi-bit shift register, each bit of which controls one capacitor's voltage. Each time a clock signal is applied to the shift register, a value in the shift register shifts another capacitor between its low and high reference voltages.

60 Claims, 14 Drawing Sheets

US 6,885,331 B2

RAMP GENERATION WITH CAPACITORS

FIELD OF THE INVENTION

The present invention relates generally to improved ramp generation techniques and, more particularly, to ramp analog-to-digital converters (ADCs) for image sensors.

BACKGROUND OF THE INVENTION

ADC circuits have numerous applications. For example, T. Sugiki et al., *A 60mW 10b CMOS Image Sensor With Column-to-Column FPN Reduction,* ISSCC 2000 Session 6, Image Sensors, Paper MP 6.4 (Feb. 7, 2000) describes a CMOS image sensor with an ADC that includes a ramp generator.

Many other CMOS image sensors use a ramp ADC which is essentially a comparator and appropriate control logic. In many conventional ramp ADCs, an analog input voltage signal is compared with a gradually increasing reference voltage or "ramp" voltage. The ramp voltage can be generated by a digital-to-analog converter ("DAC") as it sequences through and converts digital codes into analog voltages. In operation, when the ramp voltage reaches the value of the input signal, the comparator generates a signal that latches the digital code of the DAC. The latched digital code is provided as the ADC output.

It would be advantageous to have improved ramp generation techniques, particularly for ramp ADC circuitry performing readout from an integer array.

SUMMARY OF THE INVENTION

The present invention provides ramp generation techniques that can be used in performing analog-to-digital conversions such as to readout pixel signals in a CMOS sensor that uses ramp ADCs. In an exemplary embodiment, a ramp generator includes an array of capacitors controlled by a shift register. The value in the shift register controls voltages on the capacitors, producing a ramp voltage signal.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

Figure 1A:
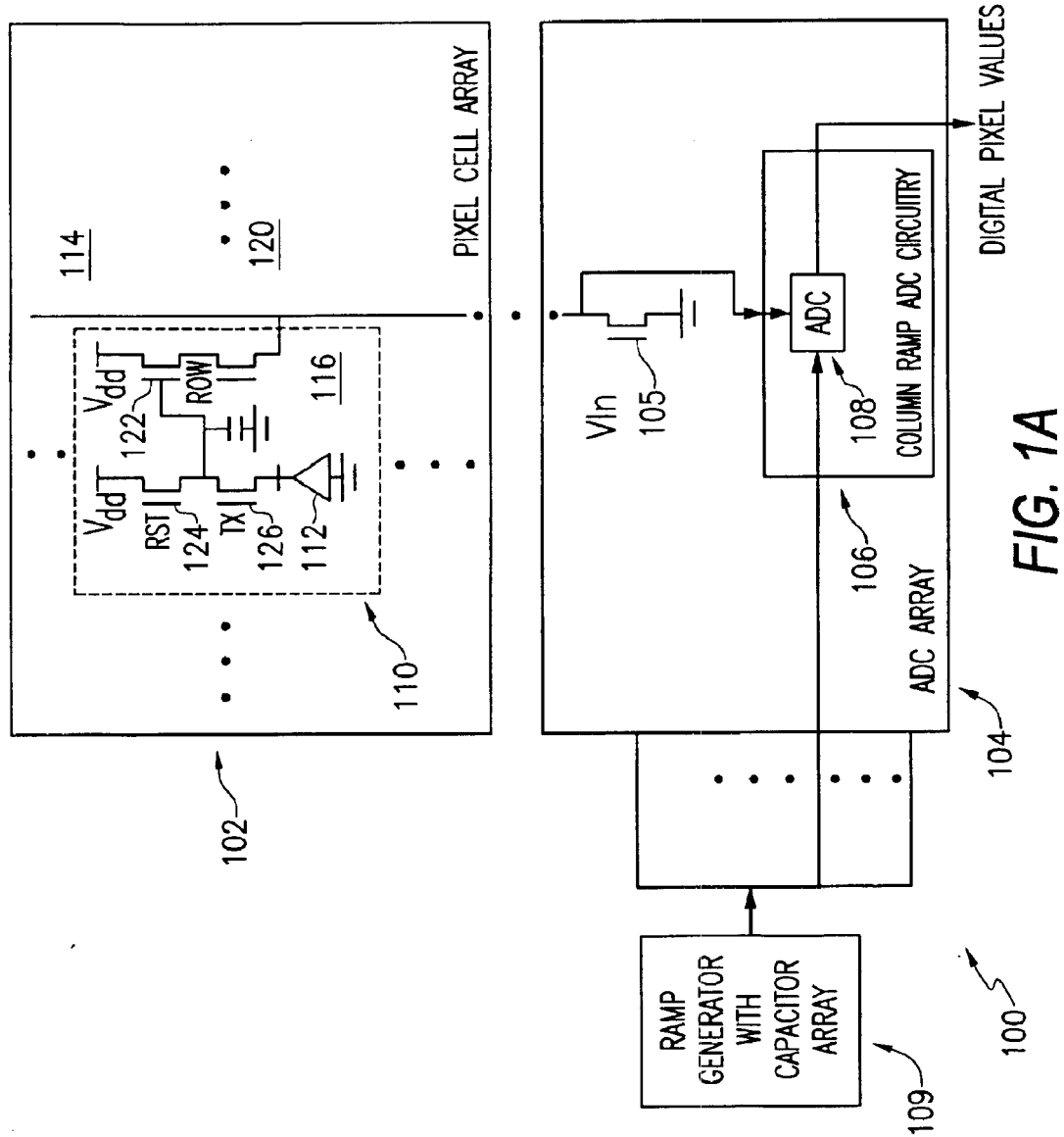
FIG. 1A is a schematic circuit diagram showing pixel cell circuitry and ADC circuitry according to an exemplary embodiment of the invention.

FIG. 1A shows imager circuitry 100 with pixel cell array 102 and ADC array 104. Exemplary pixel cell 110 is shown, illustratively as a four transistor (4 T) pixel of a type implemented in CMOS image sensors, although the invention is not limited to image sensor applications nor to CMOS circuitry with 4 T pixel cells. Pixel cell 110 includes a photosensor illustratively photodiode 112, which produces free charge carriers in response to incident light. Pixel cell 110 also includes output circuitry that provides signals on column readout line 114 indicating a voltage level at a floating diffusion node represented by capacitance 116. Array 102 includes rows and columns of pixel cells like cell 110 and the pixel cells in the same column as cell 110 are connected to column readout line 114.

Figure 8:
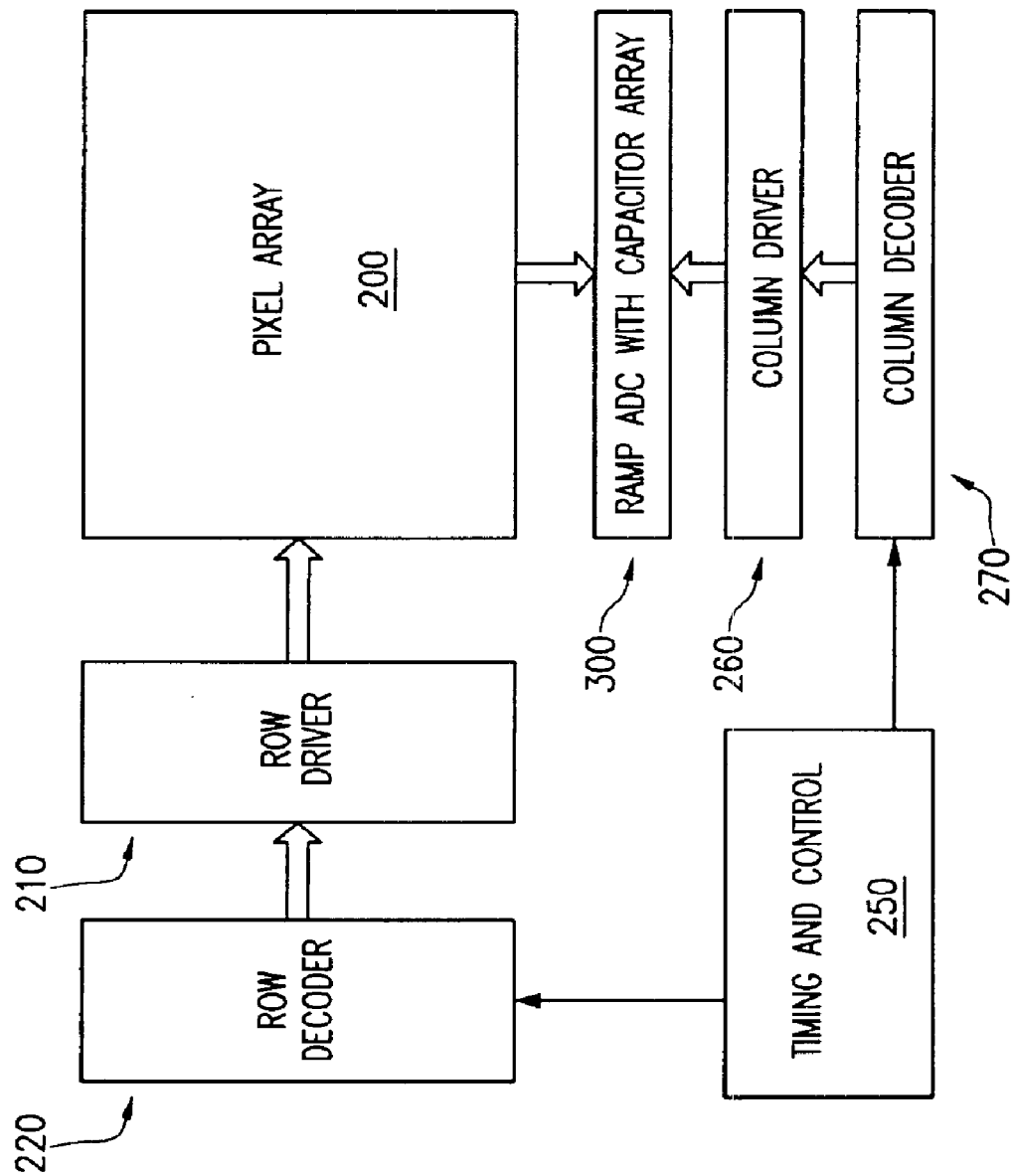
FIG. 8 is a block diagram of a CMOS image sensor chip with ADC circuitry according to any of the exemplary embodiments of FIGS. 1–7.

The output circuitry also includes transistors 120, 122, 124 and 126, which control operation of pixel cell 110 as follows: transistor 120 is turned on by row select (ROW) signal from timing and control circuitry and row decoder and driver circuitry (FIG. 8). As a result, source follower transistor 122 provides a signal on column readout line 114 indicating a voltage on capacitance 116. A reset pulse (RST) is first applied to the gate of transistor 124 to pull capacitance 116 up to $V_{dd}$. For dual sampling such as correlated double sampling (CDS), the resulting voltage $V_{rst}$ on column readout line 114 is sampled. Then, after an integration period, a transfer pulse (TX) is applied to the gate of transistor 126, and the resulting voltage $V_{sig}$ on column readout line 114 is also sampled. Then, the sampled signals $V_{rst}$ and $V_{sig}$ are used to obtain a digital signal indicating the difference ($V_{rst}-V_{sig}$). For single sampling, $V_{rst}$ is not sampled so that only $V_{sig}$ is obtained.

For that purpose, ADC array 104 includes readout circuitry for each column line; the readout circuitry for line 114 is shown with load transistor 105 controlled by signal Vln and with column ramp ADC circuitry 106 receiving the signal above transistor 105 on column readout line 114. That is, there is one ramp ADC 106 for each column of pixels in the pixel array 100 but only one ramp generator 109 with a capacitor array for all the ramp ADCs 106. Ramp ADC 106 includes one ADC 108. ADC 108 for each column receives a ramp signal from ramp generator 109. Digital pixel values from a column's ADC 108 are stored in a memory for the column (not shown) and can be read out in response to a column select signal.

It should be appreciated by one of ordinary skill in the art that rows and columns in pixel arrays are orthogonal and interchangeable. While the invention is described in terms of column ramp ADCs, the rows and the columns could be reversed due to the orthogonal nature of pixel arrays and the invention could be equivalently described in terms of an array of row ramp ADCs. It should also be appreciated that there could be at least two ramp generating circuits.

Figure 1B:
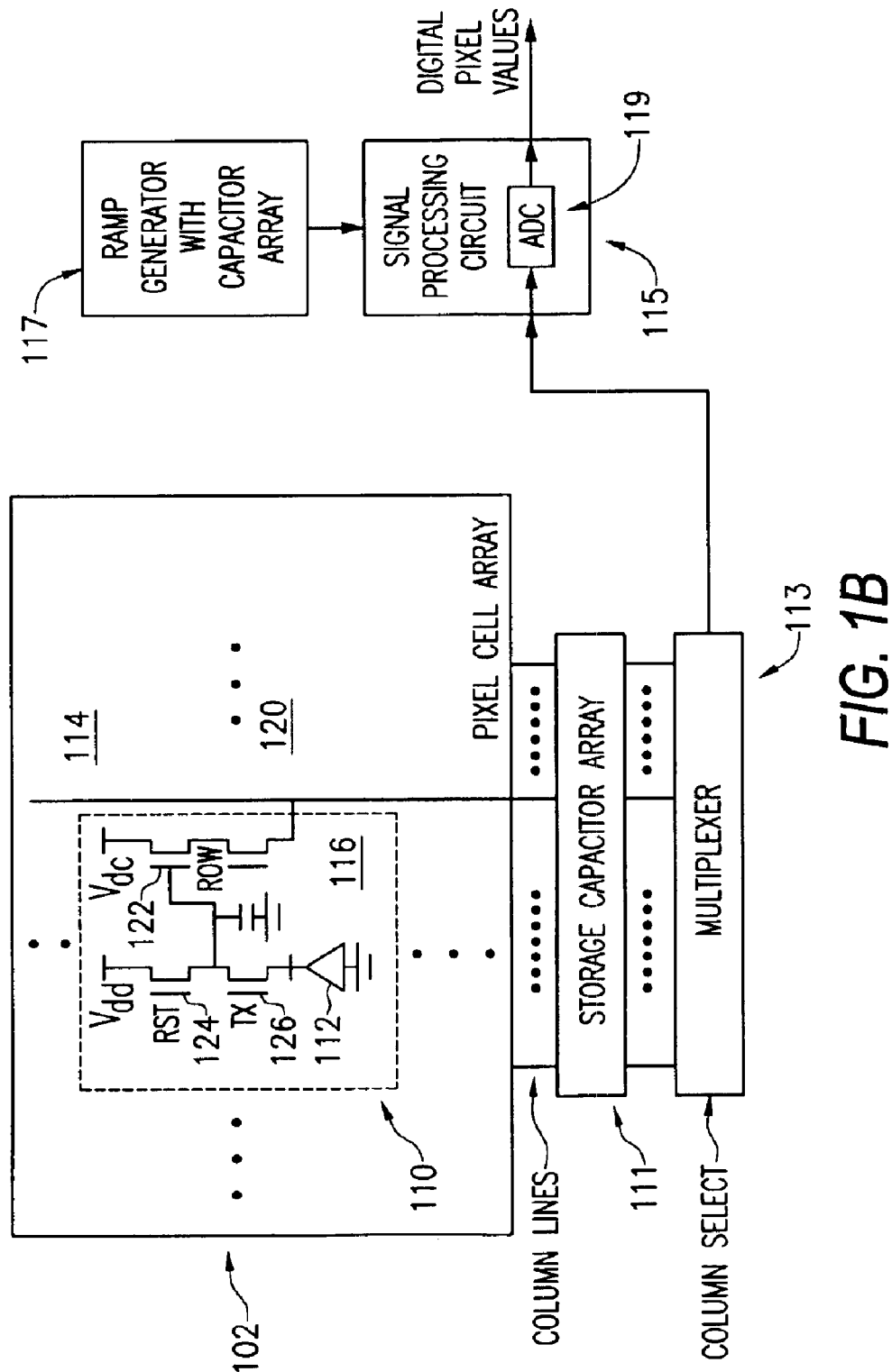
FIG. 1B is a schematic circuit diagram showing pixel cell circuitry.

Referring now to FIG. 1B, pixel cell array 102 is also described for FIG. 1A. The signals output by pixel cell array 102 are stored in a storage capacitor array 111 and available at multiplexer 113, which is controlled by a column select signal. Multiplexer 113 outputs a signal to signal process circuitry 115, which using the results provided by a ramp generator 117, generates and outputs digital pixel signal values. Signal processor circuitry includes ADC circuitry 119, which can be implemented as described below.

Figure 2A:
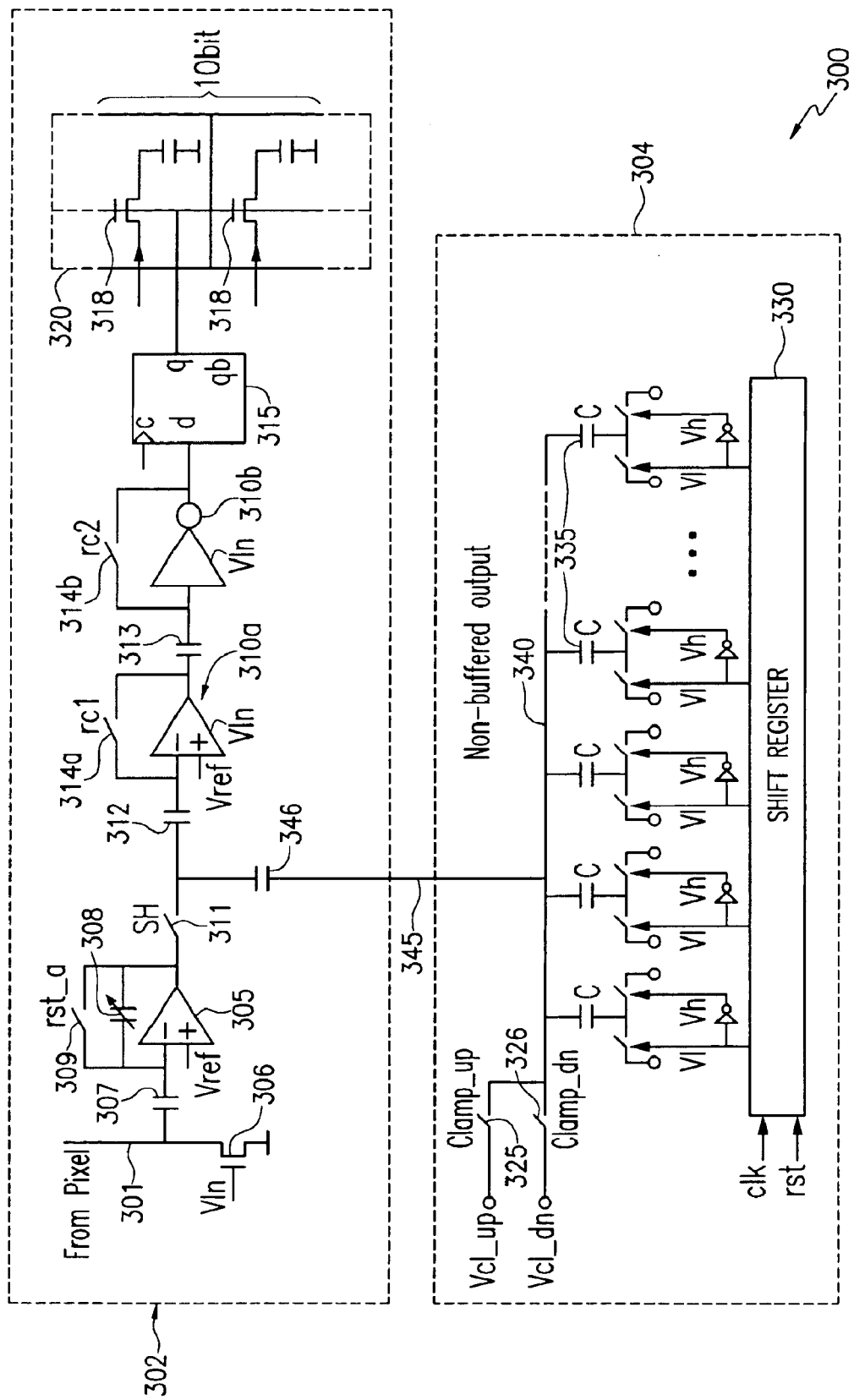
FIG. 2A is a schematic circuit diagram of an exemplary embodiment of a ramp ADC according to the present invention.

FIG. 2A is a schematic circuit diagram of an exemplary embodiment of a ramp ADC 300, which is connected to receive signals from the readout line of a column of pixels. The ramp ADC 300 includes ADC circuitry 302 and ramp generator circuitry 304.

ADC circuitry 302 includes a differential amplifier 305 as well as comparator and output circuitry. Differential amplifier 305 receives an analog voltage signal from a pixel at its "−" input through readout line 301 above load transistor 306 through capacitance 307. Connected between the output and the "−" input of amplifier 305 are variable capacitance 308 and reset switch 309, controlled by reset signal rst_a. Variable capacitance 308 may be a switched bank of capacitors, where there is a switch associated with each capacitor in the bank of capacitors and the switches can be set once per image frame to control the gain of amplifier 305 according to conventional techniques by signals from a sensor digital control block (not shown) or by signals received from off the chip through I/O pins. Capacitance 307 may also be a variable capacitance, similarly controlled. At its "+" input, amplifier 305 receives a reference signal Vref. The output from differential amplifier 305 is provided to the first of two comparators 310a via a sample-and-hold switch 311, controlled by signal SH, and through capacitance 312. The output of first comparator amplifier 310a is similarly provided to a second, inverting amplifier 310b through capacitance 313. Connected across comparator amplifier 310a is a reset switch 314a controlled by reset signal rc1. Connected across inverting amplifier 310b is a reset switch 314b controlled by reset signal rc2. The use of comparator amplifiers within the ADC relaxes the speed requirement and reduces power consumption.

The output of inverting amplifier 310b is provided to input d of a delay flip-flop 315, which acts as a synchronization latch in response to a clock signal at its c input. There is one delay flip-flop 315 per column. The use of a synchronization latch after the comparator amplifiers avoids "sparkling" noise. The q output of delay flip-flop 315 is coupled to the gate line 318 of a 10-bit DRAM counter latch 320. When gate line 318 goes high, latch 320 stores a 10-bit word from a counter (not shown). Delay flip-flop 315 and the counter are clocked by complementary clock signals (clock for counter not shown). Delay flip-flop 315 follows the output of inverting amplifier 310b and latches the signal (count) at a falling edge of clk for the next clock period. Since the data changes at a rising edge of clk, the latching and the data changing are separated by half a clock period.

The ramp generator 304 of ramp ADC 300 includes a clamp-up switch 325 that responds to a signal Clamp_up by providing Vcl_up as output and clamp-down switch 326 that responds to a signal Clamp_dn by providing Vcl_dn as output. Switches 325 and 326 operate to terminate upward and downward ramp signals respectively. A sensor digital control block (not shown) controls the clamping and other operations by providing appropriate control signals. One of the switches 325, 326 serves as a reset switch. The other of switches 325, 326 forces the ramp up (or down). The function of the switches 325, 326 depends on whether the ramp generation voltage is ascending or descending.

A shift register 330 is controlled by a clock signal (clk) and a reset signal (rst) from the sensor digital control block (not shown) and is coupled to a plurality ($2^N$) of unity capacitors 335 with a common top plate 340 and bottom plates sequentially switched from $V_{ref-low}$ (Vl) to $V_{ref-hi}$ (Vh). For example, starting with all zeroes in the shift register, a first one is shifted in from the left end at the first rising edge of the clock signal. At every rising edge of the clock signal thereafter this "1" propagates to the right by one cell of the shift register and a new "1" is shifted in to the shift register from the left end.

The clock signal is the sensor master clock. The reset signal is provided by the sensor digital control block (not shown) and remains "on"/"high" while performing the pixel sample-and-hold operations. The reset signal is released when the ramp generation circuitry is launched. With respect to the array of capacitors 335, a ten-bit ramp generator would use $2^{10}$ or 1024 capacitors.

In this embodiment the non-buffered output 345 is coupled to comparator amplifier 310a through capacitance 346. Buffered and non-buffered outputs are available, as described below in relation to FIG. 3A. Non-buffered output saves power and buffered output enhances driving capability and occupies a smaller area. To use buffered ramp generator output, the non-buffered output would be disconnected from capacitor 346 and the buffered ramp generator output would be applied to capacitor 346. Buffered output is stored in buffer 350 (See FIG. 3A). The output of the ramp generator 304 is a stepwise series of voltage levels used to compare against the pixel voltage signals to generate a digital value for each analog pixel voltage signal.

For each analog-to-digital conversion, shift register 330 is reset (zeroed). Every unity capacitor 335 is coupled to a bit of the shift register 330. For an upward/rising ramp, on every rising clock edge, any previous value in the shift register 330 is shifted right one bit and a "1" is clocked into the shift register 330. Each unity capacitor 335 that was previously at Vh remains at Vh, and the next capacitor 335 coupled to a shift register bit that changes from "0" to "1" accordingly switches from Vl to Vh thereby increasing by one the number of capacitors switched from low to high and, thus, pushing the ramp up. The above process continues until the ramp reaches the voltage level of the analog pixel voltage signal (or, for double sampling, the voltage level of the difference between $V_{rst}$ and $V_{sig}$). Then, when the voltage at the "−" input of amplifier 310a exceeds Vref, the output of amplifier 310a goes low, and the output of inverter 310b goes high, causing flip-flop 315 to signal latch 320 to store a counter value. The counter (not shown) then contains the number of clock signals to reach the voltage level and the number in the counter is the digital value of the analog pixel signal value.

Rather than shifting "1"s into the shift register 330, ramp generator 304 could instead be operated by resetting the shift register 330 with "1's" and shifting "0's" into the shift register 330, such as to obtain a downward or negative ramp voltage.

Figure 2B:
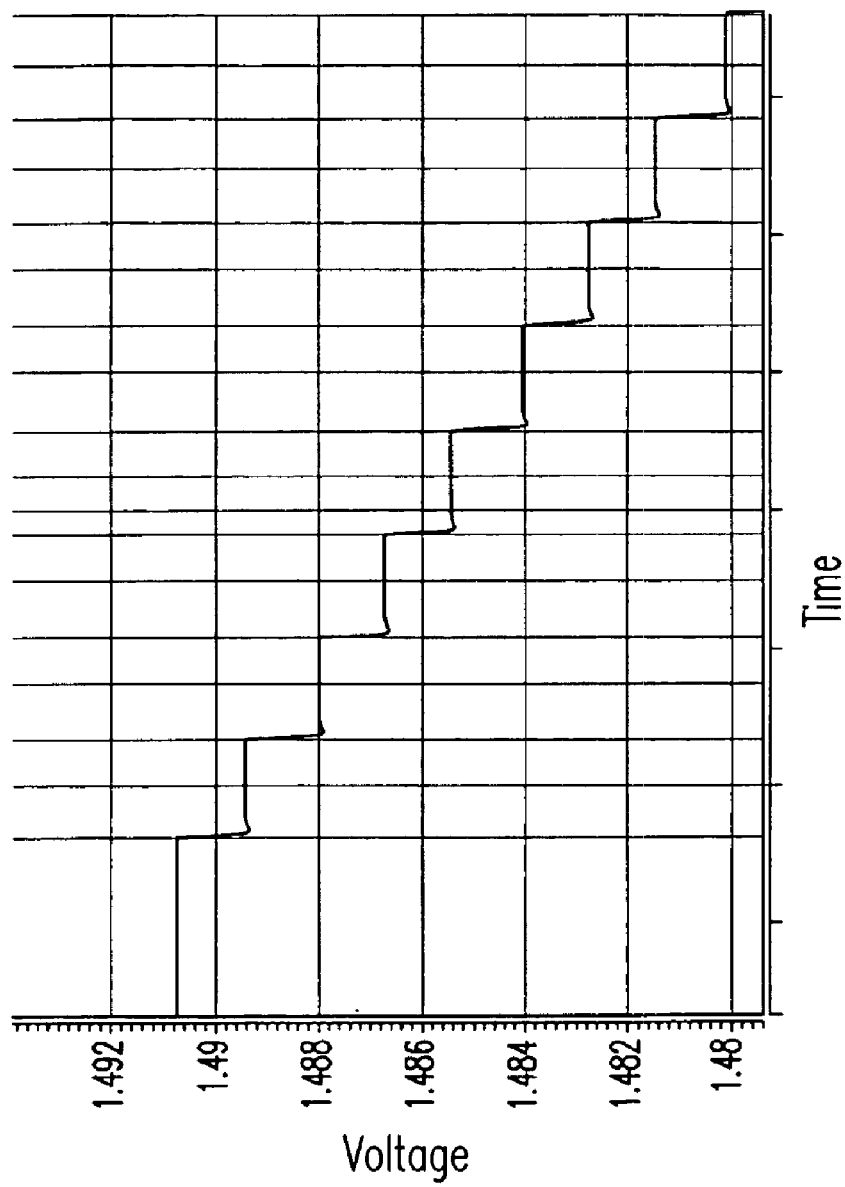
FIG. 2B shows a negative ramp signal provided by the ramp generation circuitry of FIG. 2A.

FIG. 2B shows a negative ramp signal. As used herein, a "ramp" signal includes a signal such as shown in FIG. 2B and can be upward (positive) or downward (negative). A ramp signal thus can include steps such as shown in FIG. 2B or can vary continuously and can have a constant slope or step size or can be non-linear, i.e. with a varying slope or step size. Depending on the pixel output polarity, the ramp signal needs to be either climbing up or falling down. For example, using a 4 T pinned diode pixel, a "high" reset signal $V_{rst}$ is followed by a "low" signal $V_{sig}$. Using an inverting amplifier a low-to-high transition is output. It is, thus, necessary in this case to apply a negative (falling down) ramp signal to compensate the amplified pixel signal.

Figure 3A:
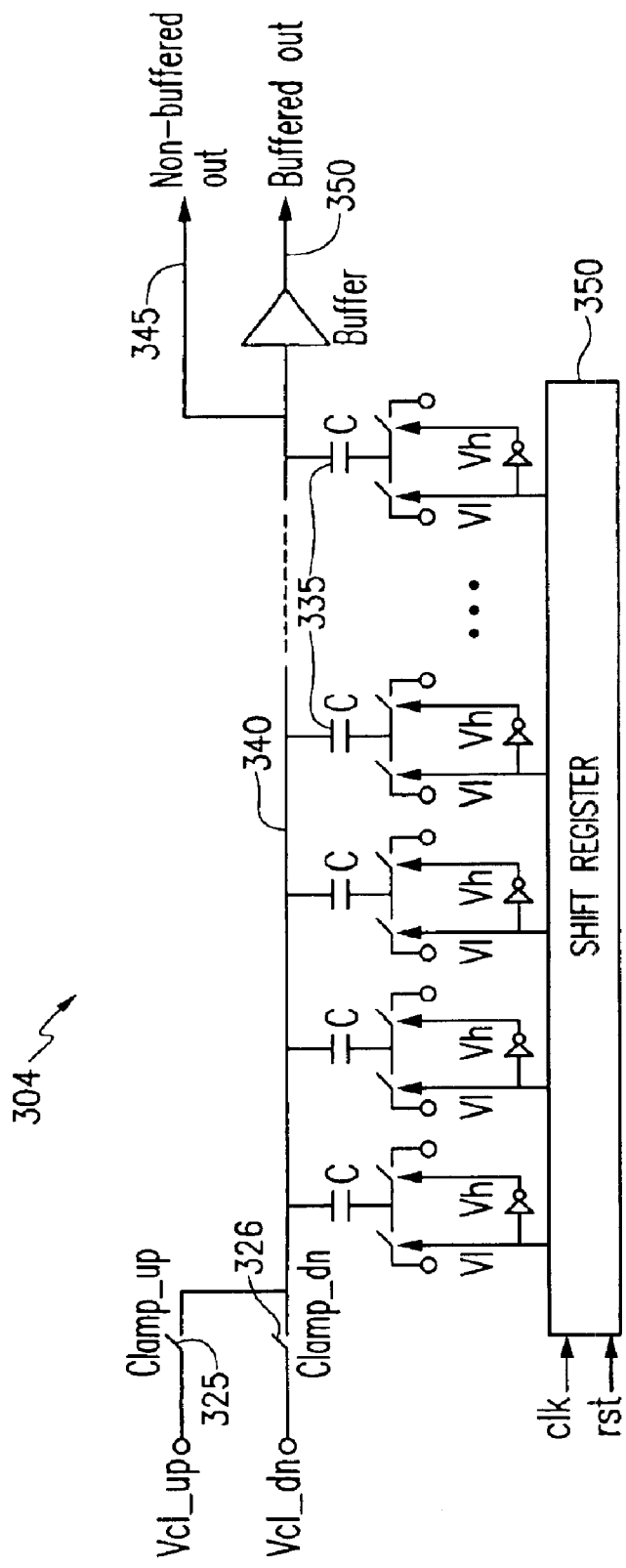
FIG. 3A is a schematic circuit diagram showing the ramp generator circuitry of FIG. 2A.

FIG. 3A shows the ramp generator 304 of FIG. 2A with buffer 350 and the buffered output.

Figure 3C:
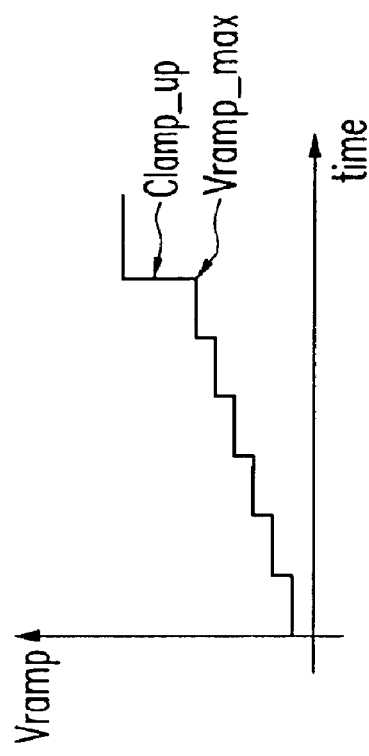
FIG. 3C shows a positive ramp signal provided by the ramp generation circuitry of FIG. 3A.
Figure 3B:
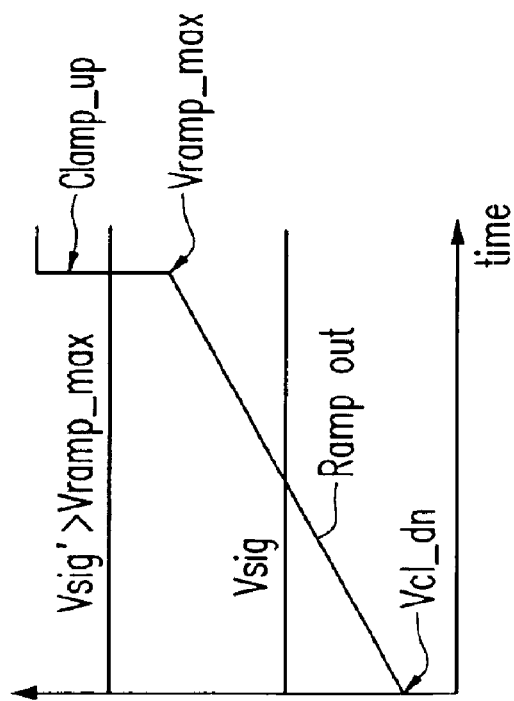
FIG. 3B is an exemplary ramp generated by the ramp ADC of FIG. 2A illustrating clamp-up.

FIG. 3B is an exemplary ramp generated by the ramp ADC 300, with the sensor digital control block (not shown) controlling the clamp-up and clamp-down switches 325, 326 to force uniform saturation. In a conventional ramp ADC, if the signal amplitude is less than the ramp swing, as illustrated by Vsig, then non-uniform pixel saturation is an issue. If the signal amplitude exceeds the ramp swing, as illustrated by Vsig'>Vramp_max, then the comparator fails to fire and noise data is written into the latches. The embodiment in FIG. 3A includes clamp-up/clamp-down switches 325 and 326, which can be operated to alleviate this problem. As can be seen in FIG. 3B, clamping the ramp "up" to a high voltage at the end of a counting cycle for an upward ramp signal, the comparator amplifier 310a is guaranteed to fire even for Vsig' and the data (e.g. all 1's) indicating ADC saturation are written into the latch 320. Similarly, the ramp can be clamped "down" to a low reference at the start of the counting cycle, serving as a reset. Clamping up and clamping down can be reversed. That is, clamping the ramp signal down can be performed at the end of a downward (negative) ramp signal and clamping the ramp signal up can be performed at the beginning of a downward ramp signal, serving as a reset.

FIG. 3C shows a stepped positive ramp signal that is clamped up at the end of the cycle in order to ensure ADC saturation.

Figure 3D:
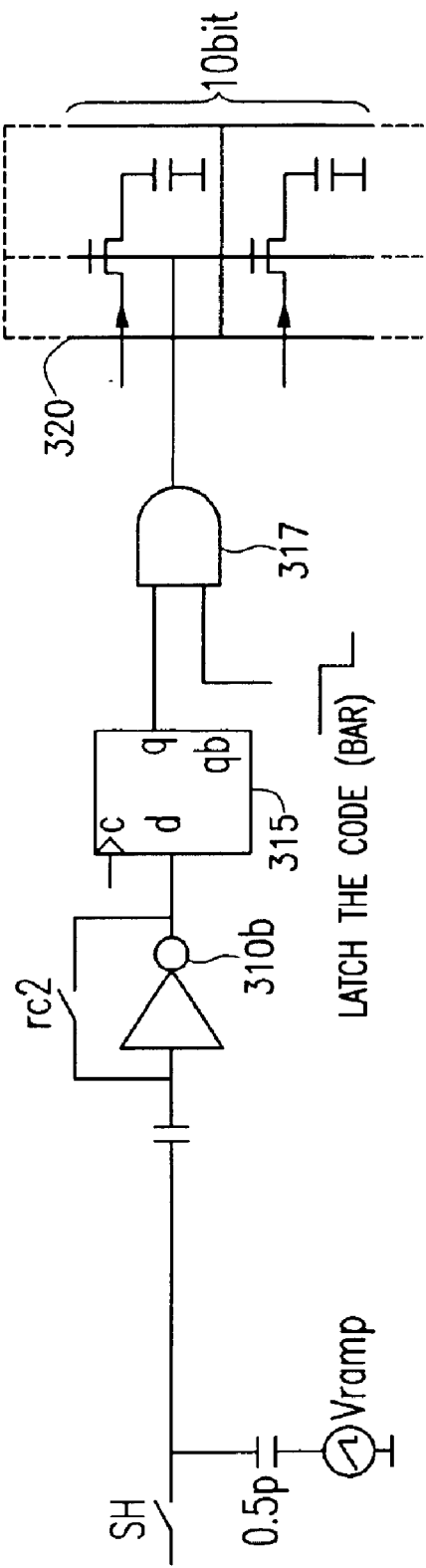
FIG. 3D is a schematic circuit diagram of an alternative exemplary embodiment of ADC circuitry that includes a logic gate to control latching.

The circuit shown in FIG. 3D is an alternative exemplary embodiment of the present invention using a logic gate to clamp the end of the ramp signal up. In this embodiment the first comparator amplifier and capacitance between the sample-and-hold switch and the first comparator amplifier are eliminated. An logic gate 317 is added between delay flip-flop 315 and counter latch 320. Logic gate 317 has two inputs. The first is the output of delay flip-flop 315 and the second is an "end of ramp/latch the code" signal, which is provided by sensor digital control block circuitry (not shown). This signal is synchronized with the counter and is enabled by the approach of the end of the count. For example, in a ten-bit ramp generator (using 1024 capacitors), this signal might be provided at the 1021$^{st}$ clock signal. Logic gate 317 responds to this signal by causing latch 320 to store the value in the counter, for example, "1111111101" at the 1021$^{st}$ clock signal. This will only occur, however, in the case where the signal amplitude is so high that the ramp signal cannot compensate it—in other cases, when the ramp signal compensates the signal amplitude, flip-flop 315 provides a high output, and logic gate 317 accordingly causes latch 320 to store a lower value from the counter. Any count that is close to the end (all 1's) could be used for this form of clamp up. Logic gate 317 is used instead of a clamp-up signal at the end of the ramp signal.

The above-described exemplary circuit embodiments could be operated in a number of ways. For example, in double sampling, depending on the type of the pixel, the first sample may be either the signal ($V_{sig}$) or the reset value ($V_{rst}$). The second sample will be the other value (signal or reset) not sampled first. The amplifiers can be auto-zeroed while reading and amplifying the first sample from the pixel. The second sample is read and amplified by the first amplifier, and a count is latched when the comparator amplifier's output switches due to the ramp reaching the difference between $V_{rst}$ and $V_{sig}$. This is equivalent to amplifying the difference between $V_{rst}$ and $V_{sig}$.

Figure 4:
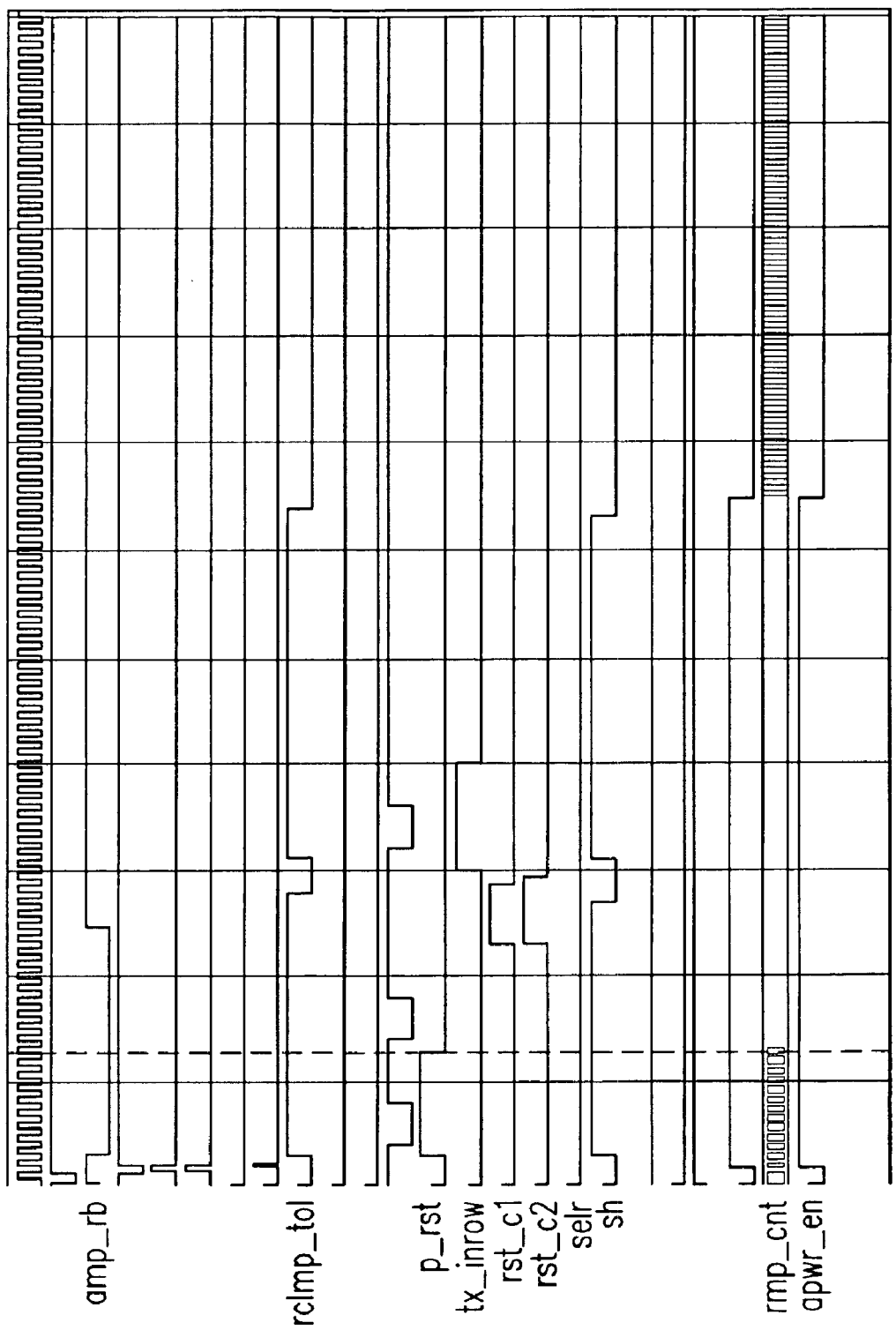
FIG. 4 is a timing diagram showing signals that occur in a simulation of an exemplary embodiment of the invention.

FIG. 4 is a timing diagram having the amplifier and ramp ADC timing and control signals used for simulations. The signals that are important to the operation of the ramp ADC of the present invention are highlighted and explained. Rst_c1 and rst_c2 are the reset signals rc1 and rc2 (shown on FIG. 2A). The reset sequence is as follows: (1) reset the pixel via p_rst and reset amplifier 305 by a falling edge of amplitude reset signal amp_rb (rst_a in FIG. 2A); (2) release pixel reset; (3) reset the first and second comparator amplifiers 310a and 310b concurrently via rst_c1 and rst_c2; (4) open amplifier 305 reset switch 309 via amp_rb; (5) open the first amplifier 310a by releasing rst_c1 and (6) open the second inverting amplifier 310b by releasing rst_c2. By sequential release of the resets, the amplifier cancels the reset noise of the pixel; the first comparator amplifier 310a cancels the reset noise of the amplifier; and the second inverting amplifier 310b cancels the reset noise of the first comparator amplifier 310a. All these operations together provide cascaded noise cancellation.

Following the sequential reset phase, the pixel transfer signal goes high (tx_inrow) and the photogate charge is dumped onto a pixel sensing node. The resulting signal on the column line is amplified by differential amplifier 305 and stored in the sample-and-hold capacitance 346 by closing the sample-and-hold switch 311 via sh (SH on FIG. 2A) while the voltage on line 345 is clamped to Vcl_dn by signal rclmp_tol (clamp_dn in FIG. 2A). After sh goes low, the ramp voltage is applied to compensate the sampled signal while the counter is incremented by rmp_cnt. When the input of the first comparator amplifier 310a reaches the zero crossing point again, which is where it was just after it was reset, the output of amplifier 310a goes low. The second inverting amplifier 310b flips back to high and the corresponding value in the counter is latched into counter latch 320 for readout.

One problem with the ramp ADC is that it must step through, one value at a time, all possible digital values that could be generated and output by the ADC. For example, if a CMOS sensor has a 12-bit resolution, then a 12-bit ramp ADC must be used to obtain the correct digital output. For a 12-bit ramp ADC there may be 4,096 steps in any signal conversion cycle to ensure that the input voltage is converted to the appropriate digital code (one of 4,096 possibilities). This is a very long conversion period, which increases by a factor of two for every additional bit of resolution in the sensor. Since it is desirable to increase the resolution of CMOS image sensors, it is desirable to increase the speed of the analog-to-digital conversion cycle.

Figure 5A:
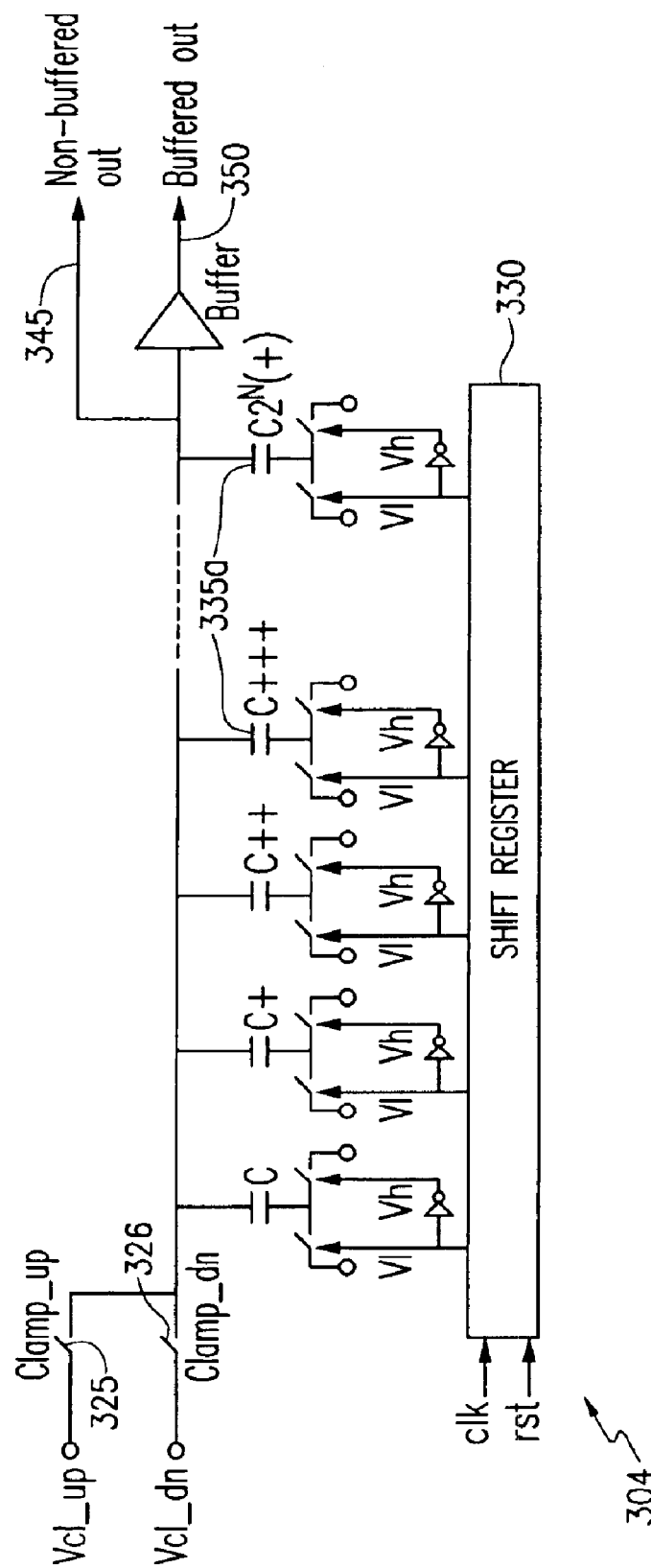
FIG. 5A is a schematic circuit diagram of another exemplary embodiment of ramp generation circuitry having an array of capacitors of increasing size.

The circuit shown in FIG. 5A is an alternative exemplary embodiment of the ramp generator 304 of the ramp ADC 300, with like components having the same reference numbers as in FIGS. 2A and 3A. The ramp generator 304 of FIG. 5A has a wide dynamic operating range using a non-linear ramp for signal compression. In this embodiment, the ramp swing can be adjusted to almost any curve and, in particular, the ramp swing can be adjusted for signal compression. This is accomplished by using a ramp generator with the capacitor size varying across the array. Typically, varying in size means increasing along the array of capacitors 335a or decreasing along the array of capacitors 335a. The capacitors 335a could, however, be used to generate an atypical ramp signal but varying the size of the capacitors 335a as needed. Using capacitors 335a of increasing size across the array, a compression ADC function will be obtained. As in FIG. 2A, a plurality ($2^N$) capacitors 335a are used in the array. The "+" indicates a next capacitor in the array of increasing size. Use of a "−" would indicate correspondingly a next capacitor in the array of decreasing size.

Figure 5C:
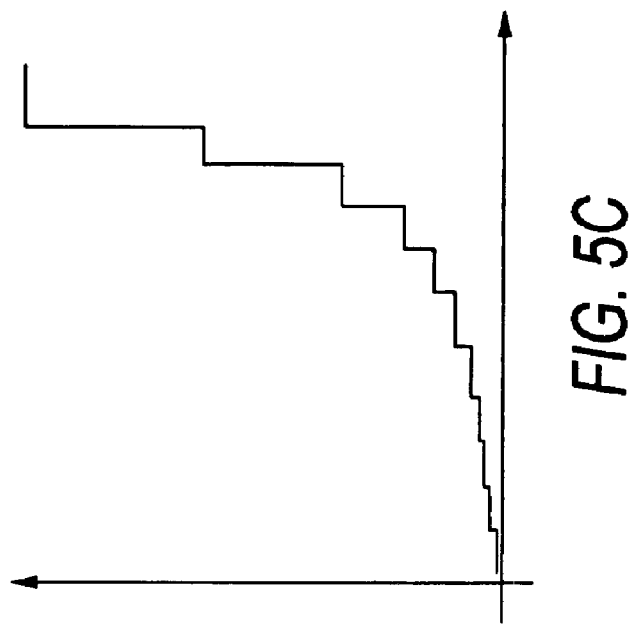
FIG. 5C shows a positive non-linear ramp signal provided by the ramp generation circuitry of FIG. 5A.
Figure 5B:
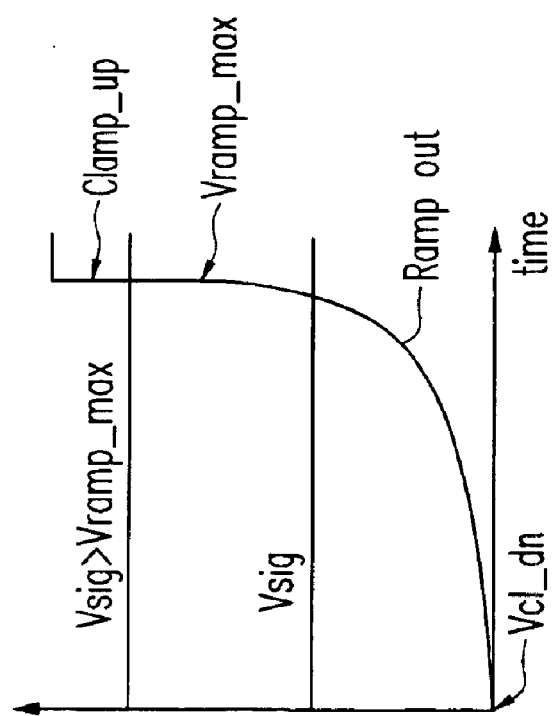
FIG. 5B is an example of a ramp swing generated by the ramp generator of FIG. 5A.

FIG. 5B is an example of a ramp swing generated by the exemplary embodiment of the ramp generator 304 of FIG. 5A, showing example signals as in FIG. 3B. By using capacitors of increasing size across the array, a compression ADC function will be obtained. The rapid swing up at the high reference end of the cycle will act to compress the ADC function from, for example, a 12 bit input to 8 bits. As can be seen from FIG. 5B, the clamp-up signal of the clamp-up/clamp-down switches was also used in this example to ensure that the comparator will fire and the data (e.g., all 1's) indicating ADC saturation will be written into the latch.

FIG. 5C shows a positive stepped non-linear ramp signal, which is clamped up at the end of the cycle. The clamp_up forces ADC saturation. The non-linearity of the ramp signal compresses the ADC function from 12 bits to 8 bits, for example.

Figure 6:
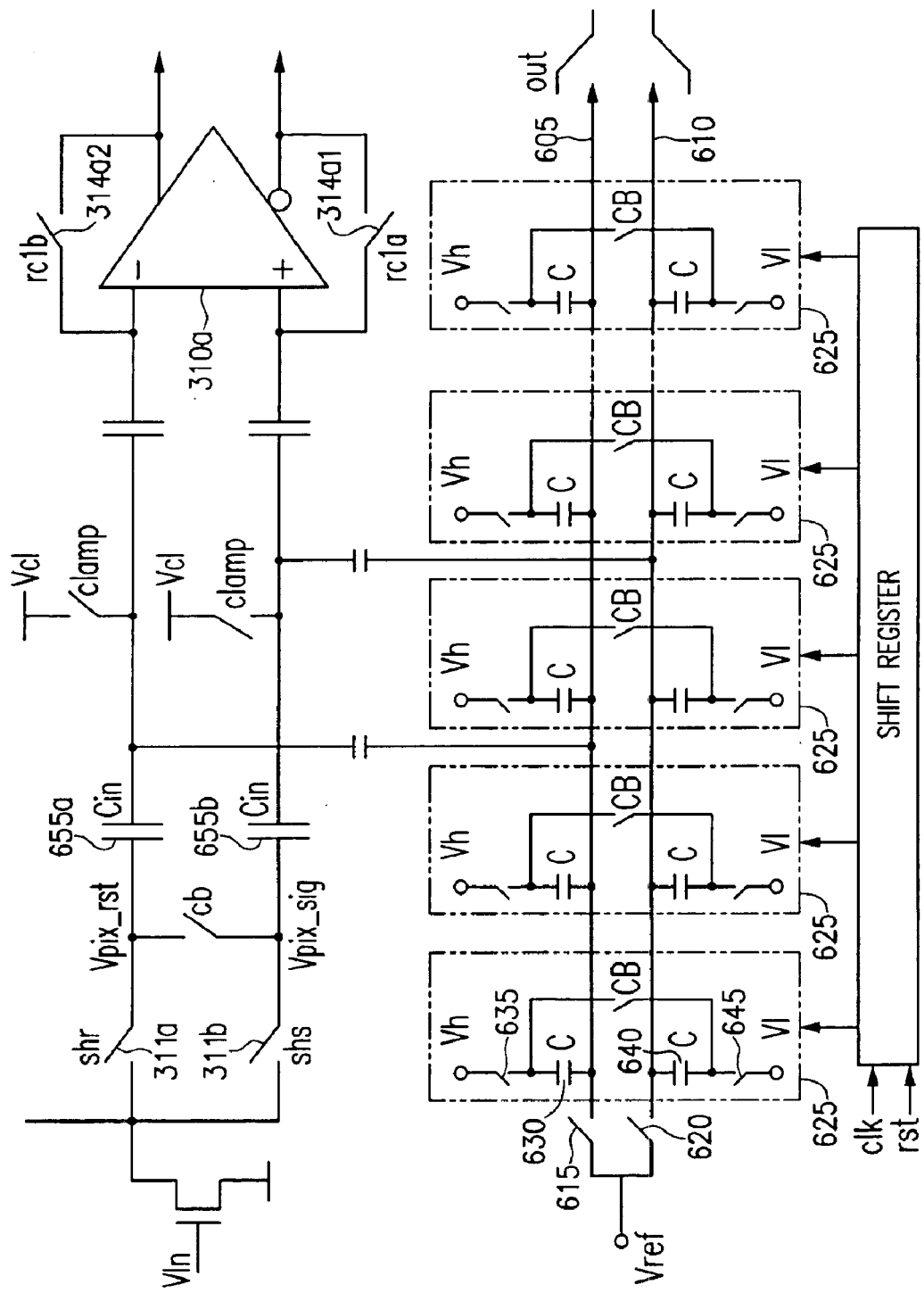
FIG. 6 is a schematic circuit diagram of another exemplary embodiment of a ramp ADC with a fully differential ramp generator.

FIG. 6 is a schematic circuit diagram of an exemplary embodiment of the present invention where the ramp ADC and the ramp generator are fully differential. The use of a crowbar switch controlled by signal cb in the ramp ADC makes the ramp ADC fully differential, which provides for common noise rejection. In the case of imagers, common noise is fixed pattern noise (FPN), which is dominated by column-to-column variations due to the column parallel readout structure. The sensor digital control block (not shown) provides the signal cb to generate fully differential signals at amplifier inputs "−" and "+" from $V_{pix\text{-}rst}$ and $V_{pix\text{-}sig}$ samples on capacitors 655a, 655b. All offsets are canceled because of capacitive coupling.

As in FIG. 2A, an amplifier (not shown) is between the pixel and the sample-and-hold reset switch 311a controlled by sample-and-hold reset signal shr and the sample-and-hold signal switch 311b controlled by sample-and-hold signal shs. Comparator amplifier 310a has two reset switches 314a1 and 314a2 respectively controlled by reset signals rc1a and rc1b. As in FIG. 2A, comparator amplifier 310a acts as a differential-to-single-ended converter, so that one output of comparator amplifier 310a is provided to an inverting amplifier (not shown), which provides input to a delay flip-flop, which operates as a synchronization latch in response to a clock signal applied to its c input. The output of the delay flip-flop (not shown) is coupled to the gate line (not shown) of a DRAM counter latch (not shown).

A first common plate line 605 is switchably coupled to a reference voltage source $V_{ref}$ via switch 615. A second common plate line 610 paired with first common plate 605 is also switchably coupled to the reference voltage source $V_{ref}$ via switch 620.

There is an array of capacitor circuits 625 where each capacitor circuit has a first capacitor 630 switchably coupled via switch 635 to a high voltage source Vh. Each capacitor circuit also has a second capacitor 640 coupled via switch 645 to a low voltage source Vl. Each capacitor circuit also has switch 650, which is connected between the first capacitor's connection to the high voltage source and the second capacitor's connection to the low voltage source. Switches 650 between Vl and Vh makes the ramp generator fully differential. The signal CB for each switch 650 can be controlled by "1's" filling the shift register 660, with CB closing switch 650 after one of switches 635 and 645 has been closed in response to the corresponding bit in shift register 660.

Figure 7:
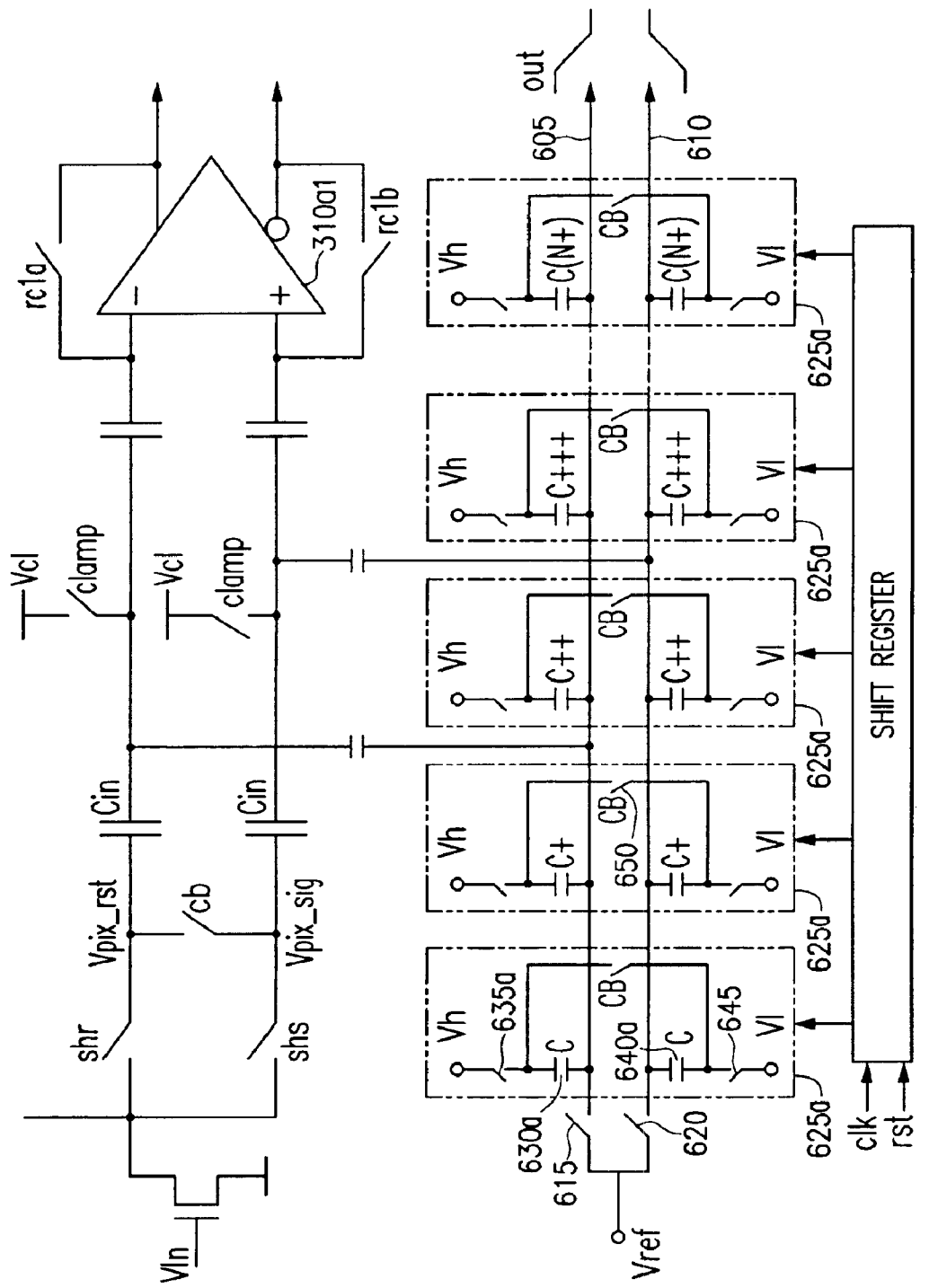
FIG. 7 is a schematic circuit diagram of another exemplary embodiment of a ramp ADC with a fully differential ramp generator and an array of capacitors of varying size.

FIG. 7 is a schematic circuit diagram of an exemplary embodiment of the present invention, with like components having the same reference numbers as in FIG. 6. As in FIG. 6, the ramp ADC and the ramp generator are fully differential, but the capacitors 630a, 640a of the capacitor circuits 625a are of varying size. Typically, varying in size means increasing along the array of capacitor circuits 625a or decreasing along the array of capacitor circuits 625a. The capacitors 630a, 640a could, however, be used to generate an atypical ramp signal by varying the size of the capacitors 630a, 640a as needed. Using capacitors 630a, 640a of increasing size across the array, a compression ADC function will be obtained.

FIG. 8 illustrates a block diagram for a CMOS imager 100 as in FIGS. 1A and 1B. The imager 100 includes a pixel array 200. The pixel array 200 comprises a plurality of pixels arranged in a predetermined number of columns and rows. The pixels of each row in array 200 are all turned on at the same time by a row select line and the pixels of each column are selectively output, such as from the column's latch 320 (FIG. 2A), by a column select line. A plurality of row and column lines are provided for the entire array 200.

The row lines are selectively activated by the row driver 210 in response to row address decoder 220 and the column select lines are selectively activated by the column driver 260 in response to column address decoder 270. Thus, a row and column address is provided for each pixel. The CMOS imager 100 is operated by the timing and control circuit 250 which controls address decoders 220, 270 for selecting the appropriate row and column lines for pixel readout, and row and column driver circuitry 210, 260 which apply driving voltage to the drive transistors of the selected row and column lines.

The pixel signal output from the pixel array is analog voltage. This pixel output signal must then be converted from an analog signal to a digital signal. Thus, the pixel output signals from array 200 are provided to analog-to-digital converter 300, which can be any of the exemplary embodiments described above in relation to FIGS. 2–7. Timing and control circuit 250 provides additional signals as described above in relation to in FIGS. 2–7, referring to a sensor digital control block.

Figure 9:
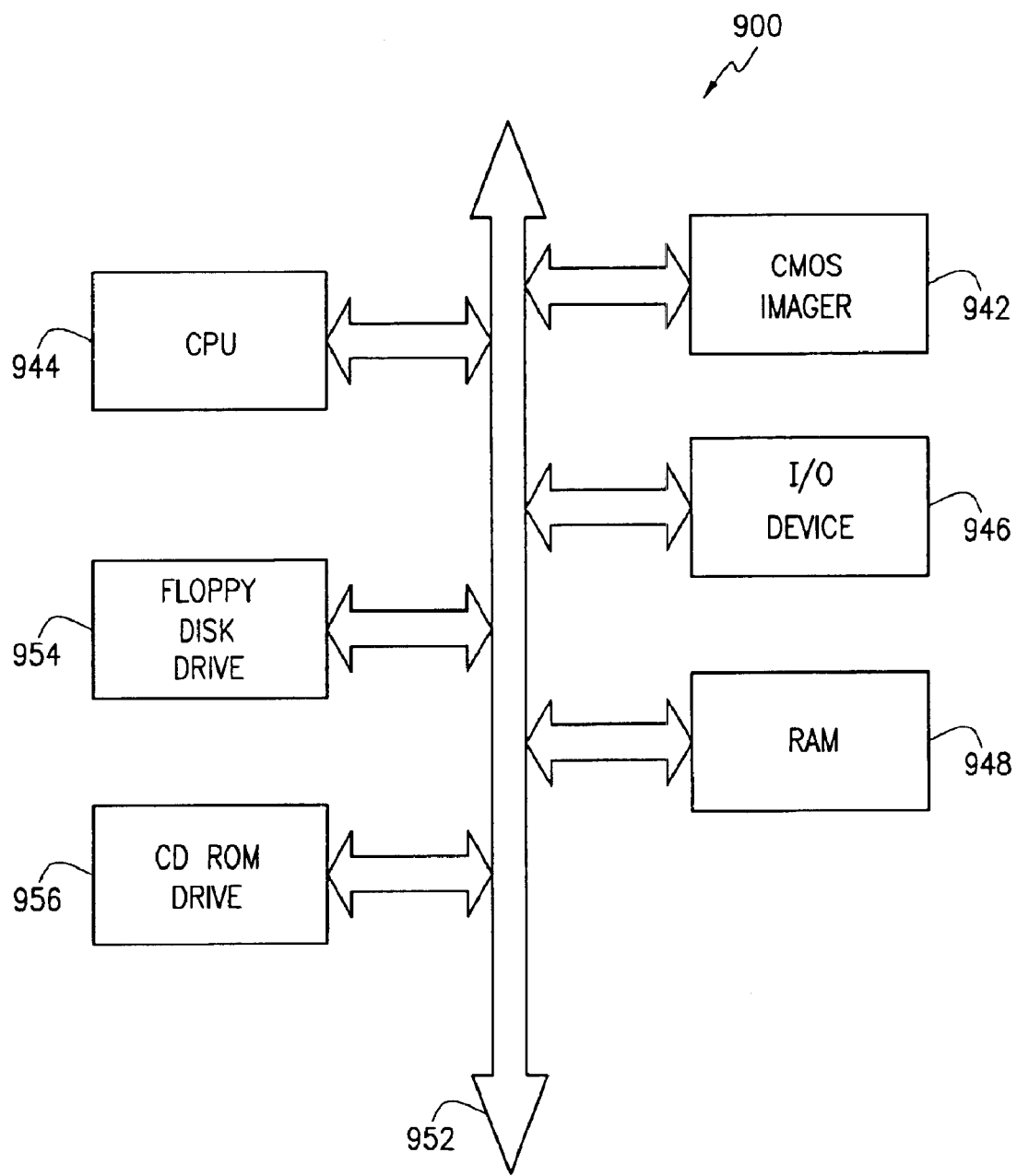
FIG. 9 is a block diagram illustrating a processor system that includes a CMOS pixel sensor chip as in FIG. 8.

A typical processor based system 900, which has a connected CMOS imager 942 having an ADC constructed according to the invention is illustrated in FIG. 9. Processor based system 900 is exemplary of a system having digital circuits which could include a CMOS image sensor. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor-based system, such as a computer system, for example, generally comprises a central processing unit (CPU) 944, for example, a microprocessor, that communicates with an input/output (I/O) device 946 over a bus 952. The CMOS imager 942 also communicates with the system over bus 952. The system 900 also includes random access memory (RAM) 948, and may include peripheral devices such as a floppy disk drive 954, and a compact disk (CD) ROM drive 956 which also communicate with CPU 944 over the bus 952. It may also be desirable to integrate the processor 944, CMOS image sensor 942 and memory 948 on a single integrated circuit.

The invention has been described using a shift register to control the voltage to each capacitor in the array of capacitors and, thus, generate a ramp of discrete voltage levels. It should be appreciated by one of ordinary skill in the art that other circuitry may be used which controls the voltage to each capacitor in the array of capacitors and, thus, generates a ramp of discrete voltage levels.

While the invention has been described and illustrated with reference to exemplary embodiments, many variations can be made and equivalents substituted without departing from the spirit or scope of the invention. Accordingly, the invention is not to be understood as being limited by the foregoing description, but is only limited by the scope of the appended claims.

What is claimed as new and devised to be protected by Letters Patent of the United States is:

1. Ramp generating circuitry comprising:
   an array of capacitances, each with a first lead connected to provide a combined output voltage and a second lead; and
   voltage control circuitry connected to the second lead of each of a set of two or more capacitances in said array, said voltage control circuitry controlling a voltage on each of said set of capacitances to produce a ramp signal of said combined output voltage, said voltage control circuitry controlling application of a first voltage and a second voltage to each capacitance in said set, where said first voltage is higher than said second voltage.

2. The ramp generating circuitry according to claim 1, in which the voltage control circuitry includes a multi-bit shift register with an output for each bit that controls whether said one of said respective first voltage and said second voltage is provided to a capacitance in said set.

3. The ramp generating circuitry according to claim 1, in which said set of capacitances includes all capacitances in said array.

4. A ramp generator comprising:
   a multi-bit shift register with a clock signal input, a reset signal input and, for each bit, an output;
   clock signal circuitry that provides a clock signal to said shift register's clock signal input;
   reset signal circuitry that provides a reset signal to said shift register's reset signal input;
   an array of capacitors having a common top plate and each of said array of capacitors having a bottom plate switched sequentially to one of a low reference voltage and a high reference voltage in response to a respective shift register bit's output, a charge on each of said capacitors in said array added to a ramp output signal on said top plate in response to a value in said shift register.

5. The ramp generator according to claim 4, further comprising a clamp-up switch and a clamp-down switch to terminate said ramp output signal.

6. The ramp generator according to claim 4, wherein said ramp output signal from said ramp generator is non-buffered.

7. The ramp generator according to claim 4, wherein said ramp output signal from said ramp generator is buffered.

8. The ramp generator according to claim 4, wherein said capacitors of said array are all the same size.

9. The ramp generator according to claim 4, wherein said capacitors of said array vary in size.

10. The ramp generator according to claim 9, wherein said capacitors of said array increase in size.

11. The ramp generator according to claim 10, wherein said increase in size produces a non-linear ramp for signal compression.

12. The ramp generator according to claim 9, wherein said capacitors of said array decrease in size.

13. A ramp analog-to-digital (ADC) converter comprising:
   a ramp generator that includes:
      an array of capacitances, each with a first lead connected to provide a combined output voltage and a second lead;
      voltage control circuitry connected to the second lead of each of a set of two or more capacitances in said array, said voltage control circuitry controlling a voltage on each of said set of capacitances to produce a ramp signal of said combined output voltage; and
   ADC comparison circuitry that receives an analog input signal and said ramp signal of said combined output voltage, said ADC comparison circuitry providing a digital output signal indicating magnitude of said analog input signal, said voltage control circuitry controlling application of a first voltage and a second voltage to each capacitance in said set, where said first voltage is higher than said second voltage.

14. A ramp analog-to-digital converter (ADC) comprising:
   an amplifier for receiving an analog voltage signal from a pixel;
   a sample-and hold switch coupled to said amplifier;
   a first comparator coupled to said sample-and-hold switch;
   a second comparator coupled to said first comparator;
   a synchronization latch coupled to said second comparator;
   a counter coupled to said synchronization latch; and
   ramp generation circuitry comprising:
      an array of capacitances, each with a first lead connected to provide a combined output voltage and a second lead; and
      voltage control circuitry connected to the second lead of each of a set of two or more capacitances in said array, said voltage control circuitry controlling a voltage on each of said set of capacitances to produce a ramp signal of said combined output voltage.

15. A ramp analog-to-digital converter (ADC) comprising:
   an amplifier for receiving an analog voltage signal from a pixel;
   a sample-and hold switch coupled to said amplifier;
   a first comparator coupled to said sample-and-hold switch;
   a second comparator coupled to said first comparator;
   a synchronization latch coupled to said second comparator;

a counter coupled to said synchronization latch; and
a ramp generator comprising:
  a multi-bit shift register with a clock signal input, a reset signal input and for each bit an output;
  clock signal circuitry that provides a clock signal to said shift register's clock signal input;
  reset signal circuitry that provides a reset signal to said shift register's reset signal input, and
  an array of capacitors having a common top plate and each of said array of capacitors having a bottom plate switched sequentially to one of a low reference voltage and a high reference voltage in response to a respective shift register bit's output, a charge on each of said capacitors in said array added to a ramp output signal on said top plate in response to a value in said shift register.

16. The ramp ADC according to claim 15, wherein said first comparator further comprises a reset switch and a capacitor.

17. The ramp ADC according to claim 15, wherein said second comparator further comprises a reset switch and a capacitor.

18. A ramp analog-to-digital converter (ADC) comprising:
an amplifier for receiving an analog voltage signal from a pixel;
a sample-and hold switch coupled to said amplifier;
a comparator coupled to said sample-and-hold switch;
a synchronization latch coupled to said comparator;
a logic gate coupled to said synchronization latch;
a counter coupled to said logic gate; and
a ramp generator comprising:
  an array of capacitances, each with a first lead connected to provide a combined output voltage and a second lead; and
  voltage control circuitry connected to the second lead of each of a set of two or more capacitances in said array, said voltage control circuitry controlling a voltage on each of said set of capacitances to produce a ramp signal of said combined output voltage.

19. A ramp analog-to-digital converter (ADC) comprising:
an amplifier for receiving an analog voltage signal from a pixel;
a sample-and hold switch coupled to said amplifier;
a comparator coupled to said sample-and-hold switch;
a synchronization latch coupled to said comparator;
a logic gate coupled to said synchronization latch;
a counter coupled to said logic gate; and
a ramp generator comprising:
  a multi-bit shift register with a clock signal input, a reset signal input and for each bit an output;
  clock signal circuitry that provides a clock signal to said shift register's clock signal input;
  reset signal circuitry that provides a reset signal to said shift register's reset signal input; and
  an array of capacitors having a common top plate and each of said array of capacitors having a bottom plate switched sequentially to one of a low reference voltage and a high reference voltage in response to a respective shift register bit's output, a charge on each of said capacitors in said array added to a ramp output signal on said top plate in response to a value in said shift register.

20. An imaging device comprising:
an amplifier for receiving an analog voltage signal from a pixel;
a sample-and-hold switch coupled to said amplifier;
a first comparator coupled to said sample-and-hold switch;
a second comparator coupled to said first comparator;
a synchronization latch coupled to said second comparator;
a counter coupled to said synchronization latch; and
a ramp generator comprising:
  a multi-bit shift register with a clock signal input, a reset signal input and for each bit an output;
  clock signal circuitry that provides a clock signal to said shift register's clock signal input;
  reset signal circuitry that provides a reset signal to said shift register's reset signal input; and
  an array of capacitors having a common top plate and each of said array of capacitors having a bottom plate switched sequentially to one of a low reference voltage and a high reference voltage in response to a respective shift register bit's output, a charge on each of said capacitors in said array added to a ramp output signal on said top plate in response to a value in said shift register.

21. An imaging device comprising:
an array of pixels;
a signal processing circuit that receives analog signals from pixels in said pixel array and provides, for each analog signal, a corresponding digital signal; and
ramp generating circuitry that provides a ramp signal to said signal processing circuitry, said ramp generating circuitry including:
  an array of capacitances, each with a first lead connected to provide a combined output voltage and a second lead; and
  voltage control circuitry connected to the second lead of each of a set of two or more capacitances in said array, said voltage control circuitry controlling a voltage on each of said set of capacitances to produce a ramp signal of said combined output voltage, said voltage control circuitry controlling application of a first voltage and a second voltage to each capacitance in said set, where said first voltage is higher than said second voltage.

22. The imaging device according to claim 21, wherein there is a single ramp generating circuit.

23. The imaging device according to claim 21, wherein there are at least two ramp generating circuits.

24. The imaging device according to claim 21, wherein said array of pixels includes columns of pixels and said signal processing circuit includes an array of column processing circuits.

25. The imaging device according to claim 24 wherein each column processing circuit includes an analog-to-digital circuit that receives ramp signals from said ramp generating circuitry.

26. The imaging device according to claim 21, wherein said signal processing circuitry includes an analog-to-digital converter (ADC).

27. The imaging device according to claim 26, wherein said array of pixels includes columns of pixels and further comprising multiplexing circuitry for providing analog pixel signals for each column to said analog-to-digital circuit.

28. An imaging device comprising:
an array of pixels;
a signal processing circuit that receives analog signals from pixels in said pixel array and provides for each analog signal a corresponding digital signal; and
ramp generating circuitry that provides a ramp signal to said signal processing circuitry, said ramp generating circuitry including:
    a multi-bit shift register with a clock signal input, a reset signal input and, for each bit, an output;
    clock signal circuitry that provides a clock signal to said shift register's clock signal input;
    reset signal circuitry that provides a reset signal to said shift register's reset signal input;
    an array of capacitors having a common top plate and each of said array of capacitors having a bottom plate switched sequentially to one of a low reference voltage and a high reference voltage in response to a respective shift register bit's output, a charge on each of said capacitors in said array added to a ramp output signal on said top plate in response to a value in said shift register.

29. The imaging device according to claim 28, wherein said array of pixels includes columns of pixels and said signal processing circuit includes, for each column, an analog-to-digital circuit the receives said ramp signal from said ramp generating circuitry.

30. An imaging device comprising:
an amplifier for receiving an analog voltage signal from a pixel;
a sample-and hold switch coupled to said amplifier;
a comparator coupled to said sample-and-hold switch;
a synchronization latch coupled to said comparator;
a logic gate coupled to said synchronization latch;
a counter coupled to said logic gate; and
a ramp generator comprising:
    a multi-bit shift register with a clock signal input, a reset signal input and for each bit an output;
    clock signal circuitry that provides a clock signal to said shift register's clock signal input;
    reset signal circuitry that provides a reset signal to said shift register's reset signal input; and
    an array of capacitors having a common top plate and each of said array of capacitors having a bottom plate switched sequentially to one of a low reference voltage and a high reference voltage in response to a respective shift register bit's output, a charge on each of said capacitors in said array added to a ramp output signal on said top plate in response to a value in said shift register.

31. An imaging device comprising:
an amplifier for receiving an analog voltage signal from a pixel;
a sample-and-hold switch coupled to said amplifier;
a first comparator coupled to said sample-and-hold switch;
a second comparator coupled to said first comparator;
a synchronization latch coupled to said second comparator;
a counter coupled to said synchronization latch; and
a ramp generator comprising:
    an array of capacitances, each with a first lead connected to provide a combined output voltage and a second lead; and
    voltage control circuitry connected to the second lead of each of a set of two or more capacitances in said array, said voltage control circuitry controlling a voltage on each of said set of capacitances to produce a ramp signal of said combined output voltage.

32. An imaging device comprising:
an amplifier for receiving an analog voltage signal from a pixel;
a sample-and hold switch coupled to said amplifier;
a comparator coupled to said sample-and-hold switch;
a synchronization latch coupled to said comparator;
a logic gate coupled to said synchronization latch;
a counter coupled to said logic gate; and
a ramp generator comprising:
    an array of capacitances, each with a first lead connected to provide a combined output voltage and a second lead; and
    voltage control circuitry connected to the second lead of each of a set of two or more capacitances in said array, said voltage control circuitry controlling a voltage on each of said set of capacitances to produce a ramp signal of said combined output voltage.

33. An integrated circuit comprising:
an array of pixel cells for sensing images, the array including two or more readout lines, each readout line being connected to a respective set of said pixel cells; and
readout circuitry outside the array of pixel cells, said readout circuitry including, for each readout line, a ramp analog-to-digital converter (ADC), that includes:
a ramp generator that includes:
    an array of capacitances, each with a first lead connected to provide a combined output voltage and a second lead;
    voltage control circuitry connected to the second lead of each of a set of two or more capacitances in said array, said voltage control circuitry controlling a voltage on each of said set of capacitances to produce a ramp signal of said combined output voltage; and
    ADC comparison circuitry that receives an analog input signal and said ramp signal of said combined output voltage, said ADC comparison circuitry providing a digital output signal indicating magnitude of said analog input signal.

34. The integrated circuit according to claim 33, in which the array of pixel cells includes rows and columns of pixel cells, each readout line being connected to said pixel cells in a respective column.

35. An imaging system comprising:
a processor;
a memory device coupled to said processor via a bus; and
an imaging device, said imaging device comprising:
    an amplifier for receiving an analog voltage signal from a pixel;
    a sample-and-hold switch coupled to said amplifier;
    a first comparator coupled to said sample-and-hold switch;
    a second comparator coupled to said first comparator;
    a synchronization latch coupled to said second comparator;
    a counter coupled to said synchronization latch; and
    a ramp generator comprising:
        an array of capacitances, each with a first lead connected to provide a combined output voltage and a second lead; and voltage control circuitry connected to the second lead of each of a set of two or more capacitances in said array, said voltage control circuitry controlling a voltage on each of said set of capacitances to produce a ramp signal of said combined output voltage.

36. An imaging system comprising:

a processor;

a memory device coupled to said processor via a bus; and an imaging device, said imaging device comprising:
- an amplifier for receiving an analog voltage signal from a pixel;
- a sample-and-hold switch coupled to said amplifier;
- a first comparator coupled to said sample-and-hold switch;
- a second comparator coupled to said first comparator;
- a synchronization latch coupled to said second comparator;
- a counter coupled to said synchronization latch; and
- a ramp generator comprising:
    - a multi-bit shift register with a clock signal input, a reset signal input and for each bit an output;
    - clock signal circuitry that provides a clock signal to said shift register's clock signal input;
    - reset signal circuitry that provides a reset signal to said shift register's reset signal input; and
    - an array of capacitors having a common top plate and each of said array of capacitors having a bottom plate switched sequentially to one of a low reference voltage and a high reference voltage in response to a respective shift register bit's output, a charge on each of said capacitors in said array added to a ramp output signal on said top plate in response to a value in said shift register.

37. An imaging system comprising:

a processor;

a memory device coupled to said processor via a bus; and an imaging device, said imaging device comprising:
- an amplifier for receiving an analog voltage signal from a pixel;
- a sample-and hold switch coupled to said amplifier;
- a comparator coupled to said sample-and-hold switch;
- a synchronization latch coupled to said comparator;
- a logic gate coupled to said synchronization latch;
- a counter coupled to said logic gate; and
- a ramp generator comprising:
    - an array of capacitances, each with a first lead connected to provide a combined output voltage and a second lead; and
    - voltage control circuitry connected to the second lead of each of a set of two or more capacitances in said array, said voltage control circuitry controlling a voltage on each of said set of capacitances to produce a ramp signal of said combined output voltage.

38. An imaging system comprising:

a processor;

a memory device coupled to said processor via a bus; and an imaging device, said imaging device comprising:
- an amplifier for receiving an analog voltage signal from a pixel;
- a sample-and hold switch coupled to said amplifier;
- a comparator coupled to said sample-and-hold switch;
- a synchronization latch coupled to said comparator;
- a logic gate coupled to said synchronization latch;
- a counter coupled to said logic gate; and
- a ramp generator comprising:
    - a multi-bit shift register with a clock signal input, a reset signal input and for each bit an output;
    - clock signal circuitry that provides a clock signal to said shift register's clock signal input;
    - reset signal circuitry that provides a reset signal to said shift register's reset signal input; and
    - an array of capacitors having a common top plate and each of said array of capacitors having a bottom plate switched sequentially to one of a low reference voltage and a high reference voltage in response to a respective shift register bit's output, a charge on each of said capacitors in said array added to a ramp output signal on said top plate in response to a value in said shift register.

39. A ramp generator comprising:

a multi-bit shift register with a clock signal input, a reset signal input and for each bit an output;

clock signal circuitry that provides a clock signal to said shift register's clock signal input;

reset signal circuitry that provides a reset signal to said shift register's reset signal input;

first and second paired common plate lines;

an array of capacitor circuits, each capacitor circuit including:
- a first capacitor connected between a switchable high voltage source and said first common plate;
- a second capacitor connected between a switchable low voltage source and said second common plate; and
- a switch connected between said first capacitor's connection to said high voltage source and said second capacitor's connection to said low voltage source; and a reference voltage signal switchably coupled to said first common plate and said second common plate.

40. The ramp generator according to claim 39, wherein each capacitor of each capacitor circuit is the same size.

41. The ramp generator according to claim 39, wherein each capacitor of each capacitor circuit can vary in size.

42. The ramp generator according to claim 41, wherein each capacitor of each capacitor circuit increases in size across said array of capacitor circuits.

43. The ramp generator according to claim 42, wherein said increase in size produces a non-linear ramp for signal compression.

44. The ramp generator according to claim 39, wherein each capacitor of each capacitor circuit decreases in size across said array of capacitor circuits.

45. A ramp analog-to-digital converter (ADC) comprising:

an amplifier for receiving an analog voltage signal from a pixel;

a sample-and hold switch coupled to said amplifier;

a first comparator coupled to said sample-and-hold switch;

a second comparator coupled to said first comparator;

a synchronization latch coupled to said second comparator;

a counter coupled to said synchronization latch; and a ramp generator comprising:
- a multi-bit shift register with a clock signal input, a reset signal input and for each bit an output;
- clock signal circuitry that provides a clock signal to said shift register's clock signal input;
- reset signal circuitry that provides a reset signal to said shift register's reset signal input;

first and second paired common plate lines;
an array of capacitor circuits, each capacitor circuit including:
  a first capacitor connected between a switchable high voltage source and said first common plate;
  a second capacitor connected between a switchable low voltage source and said second common plate; and
  a switch connected between said first capacitor's connection to said high voltage source and said second capacitor's connection to said low voltage source; and
a reference voltage signal switchably coupled to said first common plate and said second common plate.

46. The ramp ADC according to claim 45, wherein said first comparator further comprises a first reset switch, a second reset switch, a first capacitor and a second capacitor.

47. The ramp ADC according to claim 45, wherein said second comparator further comprises a first reset switch, a second reset switch, a first capacitor and a second capacitor.

48. An imaging device comprising:
an amplifier for receiving an analog voltage signal from a pixel;
a sample-and-hold switch coupled to said amplifier;
a first comparator coupled to said sample-and-hold switch;
a second comparator coupled to said first comparator;
a synchronization latch coupled to said second comparator;
a counter coupled to said synchronization latch; and
a ramp generator comprising:
  a multi-bit shift register with a clock signal input, a reset signal input and for each bit an output;
  clock signal circuitry that provides a clock signal to said shift register's clock signal input;
  reset signal circuitry that provides a reset signal to said shift register's reset signal input;
  first and second paired common plate lines;
  an array of capacitor circuits, each capacitor circuit including:
    a first capacitor connected between a switchable high voltage source and said first common plate;
    a second capacitor connected between a switchable low voltage source and said second common plate; and
    a switch connected between said first capacitor's connection to said high voltage source and said second capacitor's connection to said low voltage source; and
  a reference voltage signal switchably coupled to said first common plate and said second common plate.

49. An imaging system comprising:
a processor;
a memory device coupled to said processor via a bus; and
an imaging device, said imaging device comprising:
  an amplifier for receiving an analog voltage signal from a pixel;
  a sample-and-hold switch coupled to said amplifier;
  a first comparator coupled to said sample-and-hold switch;
  a second comparator coupled to said first comparator;
  a synchronization latch coupled to said second comparator;
  a counter coupled to said synchronization latch; and
  a ramp generator comprising:
    a multi-bit shift register with a clock signal input, a reset signal input and for each bit an output;
    clock signal circuitry that provides a clock signal to said shift register's clock signal input;
    reset signal circuitry that provides a reset signal to said shift register's reset signal input;
    first and second paired common plate lines;
    an array of capacitor circuits, each capacitor circuit including:
      a first capacitor connected between a switchable high voltage source and said first common plate;
      a second capacitor connected between a switchable low voltage source and said second common plate; and
      a switch connected between said first capacitor's connection to said high voltage source and said second capacitor's connection to said low voltage source; and
    a reference voltage signal switchably coupled to said first common plate and said second common plate.

50. A method of operating a ramp generator comprising:
applying a clock signal to a shift register, wherein each time said clock signal is applied to said shift register a count in said shift register is incremented; and
sequentially switching from a low reference voltage to a high reference voltage via a plurality of capacitors arranged in an array, a charge on each of said plurality of capacitors added to an output of said ramp generator in response to said count in said shift register.

51. The method according to claim 50, further comprising applying a reset signal to said shift register.

52. A method of operating a ramp analog-to-digital converter (ADC) comprising:
resetting a pixel via a pixel reset signal;
releasing said pixel reset signal;
resetting an amplifier via an amplifier reset signal;
concurrently resetting a first comparator via a first comparator reset signal and a second comparator via a second comparator reset signal;
releasing said amplifier reset signal;
releasing said first comparator reset signal;
releasing said second comparator reset signal;
dumping a photogate charge onto a pixel sensing node;
amplifying said photogate charge;
storing said amplified photogate charge in a sample-and hold circuit; and
applying a ramp voltage signal generated by a ramp generator to compensate the amplified photogate signal.

53. A method of generating a ramp signal comprising:
during each interval of a series of intervals, providing to an input lead of each of a set of capacitances, one of a respective low voltage and a respective high voltage, said capacitances having output leads that are connected to provide a combined output voltage; and
providing, in each interval, said one of said respective low voltage and said respective high voltage to produce said ramp signal, said ramp signal being said combined output voltage over said series of intervals.

54. A method of operating an integrated circuit comprising:
resetting a pixel via a pixel reset signal;
releasing said pixel reset signal;

resetting an amplifier via an amplifier reset signal;
concurrently resetting a first comparator via a first comparator reset signal and a second comparator via a second comparator reset signal;
releasing said amplifier reset signal;
releasing said first comparator reset signal;
releasing said second comparator reset signal;
dumping a photogate charge onto a pixel sensing node;
amplifying said photogate charge;
storing said amplified photogate charge in a sample-and hold circuit; and
applying a ramp voltage signal generated by a ramp generator to compensate the amplified photogate signal.

55. A method of operating an imaging device comprising:
resetting a pixel via a pixel reset signal;
releasing said pixel reset signal;
resetting an amplifier via an amplifier reset signal;
concurrently resetting a first comparator via a first comparator reset signal and a second comparator via a second comparator reset signal;
releasing said amplifier reset signal;
releasing said first comparator reset signal;
releasing said second comparator reset signal;
dumping a photogate charge onto a pixel sensing node;
amplifying said photogate charge;
storing said amplified photogate charge in a sample-and hold circuit; and
applying a ramp voltage signal generated by a ramp generator to compensate the amplified photogate signal.

56. A method of operating an imaging system comprising:
resetting a pixel via a pixel reset signal;
releasing said pixel reset signal;
resetting an amplifier via an amplifier reset signal;
concurrently resetting a first comparator via a first comparator reset signal and a second comparator via a second comparator reset signal;
releasing said amplifier reset signal;
releasing said first comparator reset signal;
releasing said second comparator reset signal;
dumping a photogate charge onto a pixel sensing node;
amplifying said photogate charge;
storing said amplified photogate charge in a sample-and hold circuit; and
applying a ramp voltage signal generated by a ramp generator to compensate the amplified photogate signal.

57. An integrated circuit comprising:
ramp generating circuitry, said ramp generating circuitry further comprising:
an array of capacitances, each with a first lead connected to provide a combined output voltage and a second lead; and
voltage control circuitry that provides to said second lead, a set of capacitances, one of a respective low voltage and a high voltage during each of a series of intervals, said voltage control circuitry providing said one of said respective low voltage and said high voltage in each interval to produce a ramp of said combined output voltage over said series of intervals.

58. An imaging device comprising:
a pixel array; and
an array of analog-to-digital converters (ADCs), each ADC of said array of ADCs further comprising:
an amplifier for receiving an analog voltage signal from a pixel of said pixel array;
a sample-and-hold switch coupled to said amplifier;
a first comparator coupled to said sample-and-hold switch;
a second comparator coupled to said first comparator;
a synchronization latch coupled to said second comparator;
a counter coupled to said synchronization latch; and
ramp generating circuitry further comprising:
an array of capacitances, each with a first lead connected to provide a combined output voltage and a second lead; and
voltage control circuitry connected to the second lead of each of a set of two or more capacitances in said array, said voltage control circuitry controlling a voltage on each of said set of capacitances to produce a ramp signal of said combined output voltage.

59. An imaging device comprising:
a pixel array; and
an array of analog-to-digital converters (ADCs), each ADC of said array of ADCs further comprising:
an amplifier for receiving an analog voltage signal from a pixel;
a sample-and hold switch coupled to said amplifier;
a comparator coupled to said sample-and-hold switch;
a synchronization latch coupled to said comparator;
a logic gate coupled to said synchronization latch;
a counter coupled to said logic gate; and
ramp generating circuitry further comprising:
an array of capacitances, each with a first lead connected to provide a combined output voltage and a second lead; and
voltage control circuitry connected to the second lead of each of a set of two or more capacitances in said array, said voltage control circuitry controlling a voltage on each of said set of capacitances to produce a ramp signal of said combined output voltage.

60. Ramp generating circuitry comprising:
an array of capacitances, each with a first lead connected to provide a combined output voltage and a second lead; and
voltage control circuitry that provides to said second lead of a set of capacitances in the array one of a respective low voltage and a high voltage during each of a series of intervals, said voltage control circuitry providing said one of said respective low voltage and said high voltage in each interval to produce a ramp of said combined output voltage over said series of intervals.

* * * * *